(12) United States Patent
Nam et al.

(10) Patent No.: US 6,223,096 B1
(45) Date of Patent: Apr. 24, 2001

(54) ELEVATOR SYSTEM FOR TRANSFERRING A WAFER BOAT WITH AUTOMATIC HORIZONTAL ATTITUDE CONTROL

(75) Inventors: Ki-huem Nam; Hyun Han; Sun-woo Kawk, all of Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/144,824

(22) Filed: Sep. 1, 1998

(30) Foreign Application Priority Data

Nov. 21, 1997 (KR) ................................................ 97-61934

(51) Int. Cl.⁷ ...................................................... G06F 7/00
(52) U.S. Cl. ............................................ 700/213; 414/935
(58) Field of Search ............................ 700/213; 414/935, 414/940, 937, 222

(56) References Cited

U.S. PATENT DOCUMENTS

| | | | |
|---|---|---|---|
| 5,314,574 | * | 5/1994 | Takahashi ............................ 156/646 |
| 5,484,483 | * | 1/1996 | Kyogoku ............................. 118/719 |
| 5,604,443 | * | 2/1997 | Kitamura et al. .................... 324/754 |
| 5,674,039 | * | 10/1997 | Walker et al. ....................... 414/222 |
| 5,697,749 | * | 12/1997 | Iwabuchi et al. .................... 414/217 |
| 5,780,849 | * | 7/1998 | Kikuchi ........................... 250/231.13 |
| 5,857,827 | * | 1/1999 | Asakawa et al. .................... 414/779 |

* cited by examiner

Primary Examiner—Christopher P. Ellis
Assistant Examiner—Khoi H. Tran
(74) Attorney, Agent, or Firm—Jones Volentine, LLC

(57) ABSTRACT

An elevator system automatically adjusts the inclination of a wafer boat during the manufacturing of semiconductor devices so that the wafers in the boat are maintained horizontal during their processing. The elevator system includes the wafer boat, a base on which the boat is supported, an elevator for loading the boat into a processing chamber and removing it from the chamber, a sensing unit for detecting the inclination of the boat relative to the horizontal, a horizontal control unit which is interposed between the base and the elevator and is drivable to maintain the boat in such a position that the wafers in the boat lie in horizontal planes, and a control unit for receiving information from the sensing unit and, based on the information, outputting a control signal to the horizontal control unit.

33 Claims, 12 Drawing Sheets

ELEVATOR SYSTEM FOR TRANSFERRING A WAFER BOAT WITH AUTOMATIC HORIZONTAL ATTITUDE CONTROL

BACKGROUND OF THE INVENTION

1. Field of the Invention

The present invention relates to an elevator system for transferring a boat during the manufacture of semiconductor devices. More particularly, the present invention relates to an elevator system for transferring a wafer boat such that the wafers in the a boat are maintained horizontal.

2. Description of the Related Art

In general, the fabrication of a semiconductor device involves the execution of a plurality of processes. Therefore, various kinds of equipment and auxiliary devices are used to fabricate a semiconductor device.

These processes include a diffusion process in which a semiconductor device is provided with certain electrical characteristics. The process of diffusion includes a step of forming an oxide film on a wafer, and an annealing step in which the surface of the wafer is exposed to a solid or gas containing boron, phosphorus or the like under a high temperature.

A prior art furnace (FIG. 1) in which the diffusion process takes place comprises a quartz tube 19 and a heating chamber 18 for heating the quartz tube. The quartz tube 19 isolates the wafers 10 from the environment while the diffusion process is being carried out.

The auxiliary devices include an elevator 17 for loading/unloading a boat 14 of wafers 10 into/from the furnace, a wafer transfer device 13 for transferring the wafers 10 into and out of the boat 14, a cassette transfer device 12 for transferring a cassette 11 containing a plurality of the wafers 10 to the wafer transfer device 13, a control unit (not shown) for controlling the above-mentioned devices, and a gas supply unit for injecting refined gas into the heating chamber 18.

In addition to the boat 14, the conventional elevator system comprises a base 15 disposed under and supporting the boat 14, an elevator 17 for moving up and down, and a horizontal control plate 16 interposed between an upper plate of the elevator 17 and the base 15. The horizontal control plate 16 is manually adjustable to control the horizontal attitude of the base 15.

More specifically, as shown in FIG. 2, four hex head bolts 20 extend through the horizontal control plate 16 and into the base 15. The bolts 20 are arrayed along a pair of X and Y axes. The attitude of the wafers 10 with respect to the horizontal is controlled by rotating the hex head bolts 20 clockwise or counterclockwise and thereby adjusting the angle between the base 15 and the horizontal control plate 16. A respective pair of wing nuts 21 are provided at opposite sides of each hex head bolt 20 to fasten the bolt 20 and prevent the bolt 20 from becoming loose.

The boat 14 should extend vertically from and at a right angle to the base 15. However, the boat can become inclined when overloaded or due to pressure from the exterior environment. If such a situation were not attended to, the wafers would not be processed properly, and the equipment could be damaged. Accordingly, the operator periodically loosens the wing nuts 21 and rotates the hex head bolts 20 to manually adjust the base 15 by eye. Once the base 15 is adjusted and the boat is perceived by the operator to extend perfectly vertically, the operator tightens the wing nuts 21 to lock the bolts 20 in place.

However, the task of adjusting the base 15 is onerous because the operator must rotate the hex head bolts one or more times depending on his visual acuity, and the work of adjusting the hex head bolts and of loosening and tightening the eight wing nuts is very time-consuming.

SUMMARY OF THE INVENTION

Therefore, an object of the present invention is to overcome one or more of the problems, disadvantages and limitations of the related art.

More specifically, one object of the present invention is to provide an elevator system for transferring a wafer boat, wherein the wafers in the boat are automatically oriented so as to lie horizontally.

Another object of the present invention is to provide an elevator system for transferring a wafer boat, wherein any deviation from the horizontal of the attitude of the wafers in the boat is corrected without operator intervention.

To achieve these and other advantages, the elevator system of the present invention includes the wafer boat, a base on which the boat is supported, an elevator for elevating the boat into a processing chamber and lowering it out of the chamber, a sensing unit for detecting the inclination of the boat relative to the horizontal, a horizontal control unit which is interposed between the base and the elevator and is drivable to maintain the boat in such a position that the wafers in the boat lie in horizontal planes, and a control unit for receiving information from the sensing unit and, based on the information, outputting a control signal to the horizontal control unit.

The horizontal control unit comprises a horizontal control plate fixed to the elevator, and a plurality of horizontal control driving units interposed between the base and the horizontal control plate. Each of the horizontal control driving units is movable up and down between the base and the horizontal control plate. The horizontal control unit also comprises a driving force generating unit for driving the horizontal control driving units so that the base can be tilted and hence, the inclination of the wafers relative to the horizontal can be adjusted.

The sensing unit can comprise sensors which either detect the actual inclination of the base and/or wafers relative to the horizontal or which provide feedback to indicate that the base and/or wafers are out of alignment with respect to a horizontal plane. For instance, the sensing unit may essentially consist of a level gauge, a pendulum, or two pairs of photo-sensors and light-emitting sensors. In the latter case, the photo-sensors and light-emitting sensors are arrayed such that the incident rays of light from the light-emitting sensors are directed to intersect each other perpendicularly. Receipt or non-receipt of these rays by the photo-sensors is indicative of the axis about which the horizontal control plate must be tilted to bring the wafers back to the horizontal.

The elevator system may also include a display unit connected to the control unit and displaying the information received from the sensing unit. Based on the information displayed, an operator can issue an order to the control unit to effect an alignment of the wafers with the horizontal. In this case, an input unit is connected to the control unit, receives the order keyed into the system by the operator, codes the order, and sends the coded order to the control unit.

BRIEF DESCRIPTION OF THE DRAWINGS

These and other objects, features and advantages of the present invention will become more apparent from the following detailed description of the preferred embodiments thereof made with reference to the accompanying drawings, of which.

DETAILED DESCRIPTION OF THE PREFERRED EMBODIMENTS

The present invention will now be described in detail referring to the accompanying drawings.

Figure 1:
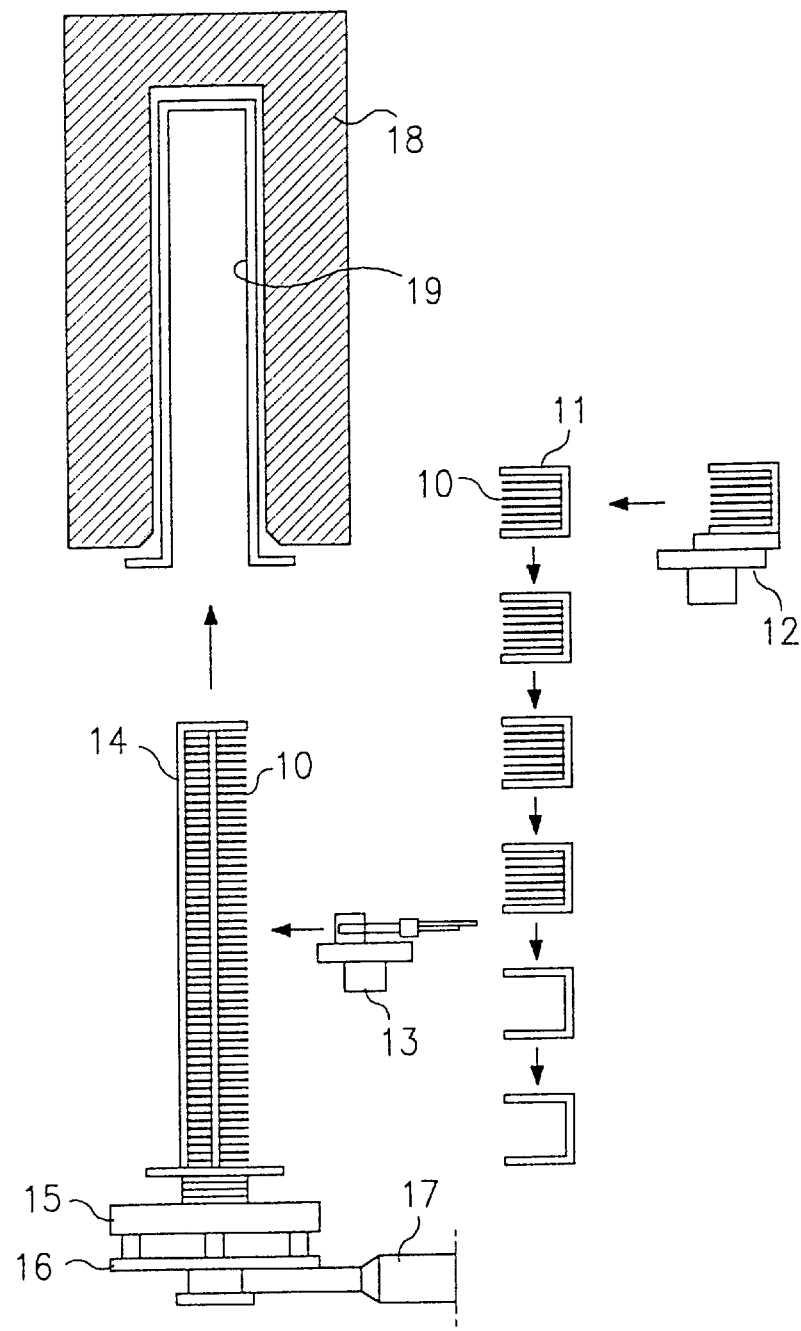
FIG. 1 is a schematic diagram of a conventional elevator system for transferring a wafer boat.
Figure 2:
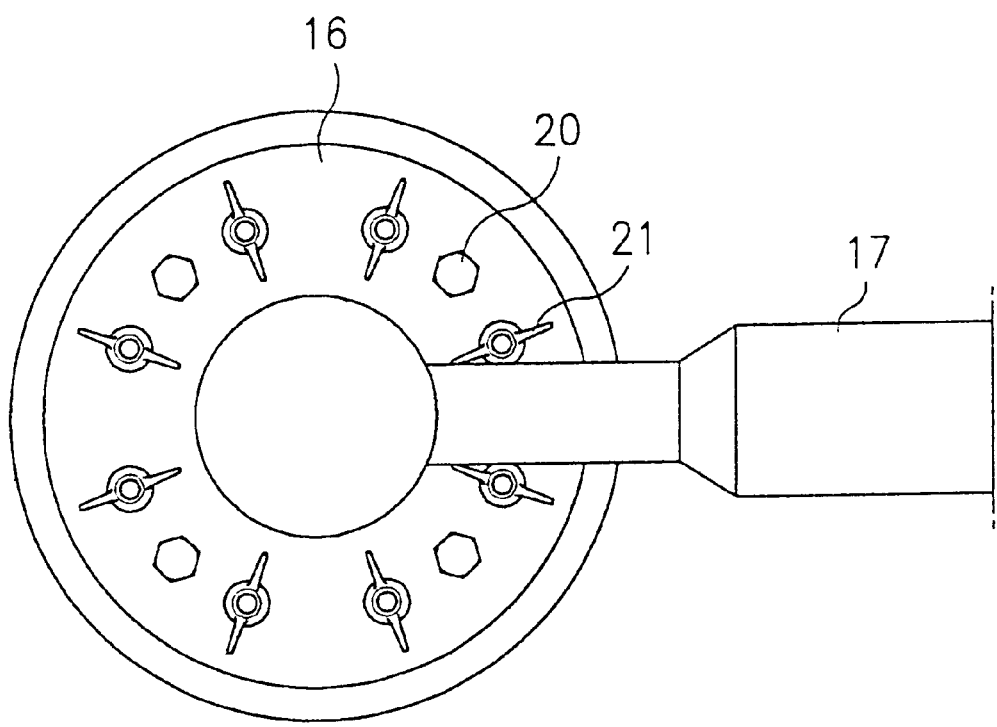
FIG. 2 is a bottom view of the elevator of the conventional elevator system shown in FIG. 1.
Figure 3:
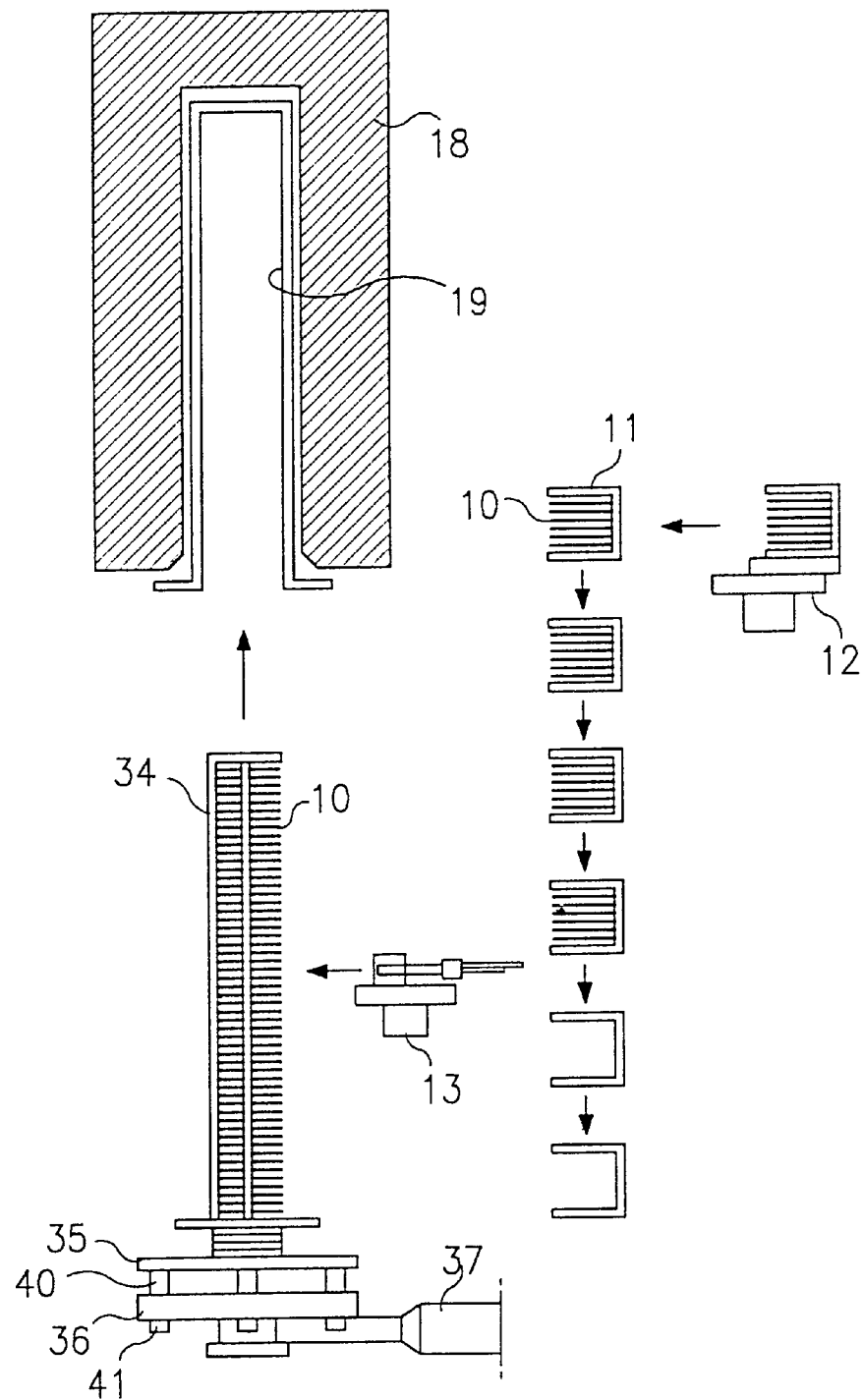
FIG. 3 is a schematic diagram of one embodiment of an elevator system for transferring a wafer boat according to the present invention.
Figure 4:
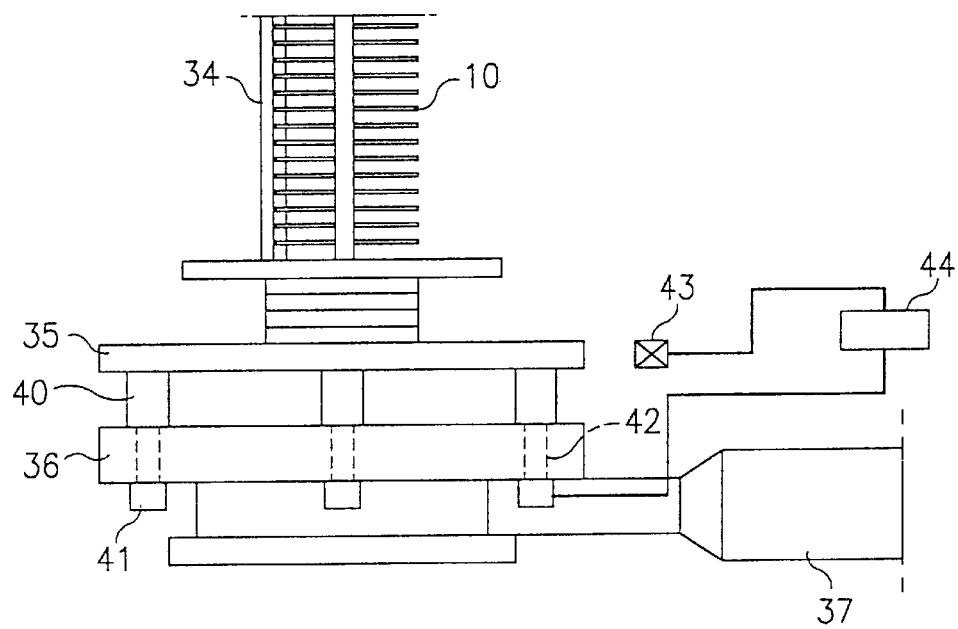
FIG. 4 is an enlarged view of a portion of the elevator system according to the present invention.

Referring to FIG. 3 and FIG. 4, a vertically oriented boat 34 made of quartz transfers a plurality of wafers 10 into a processing chamber 18 while supporting the wafers 10 horizontally. A disk-shaped base 35 supports the boat 34. The base 35, in turn, is supported by a vertically moving elevator 37, and a horizontal control plate 36 fixed to the elevator 37.

A plurality of horizontal control driving units 40 support the boat 34 and the base 35. Each unit 40 is movable up and down between the bottom of the base 35 and the top of the horizontal control plate 36 so as to adjust the distance between the two. Accordingly, the horizontal control driving units 40 control the horizontal attitude of the base 35.

Driving force generating mechanisms 41 are operatively connected to the horizontal control driving units 40 for driving the horizontal control driving units 40 up and down.

A control unit 44 receives information indicative of the attitude of the wafers from a sensor unit 43. Based on this information, the control unit 44 controls the operation of the horizontal control driving units 40.

Figure 5:
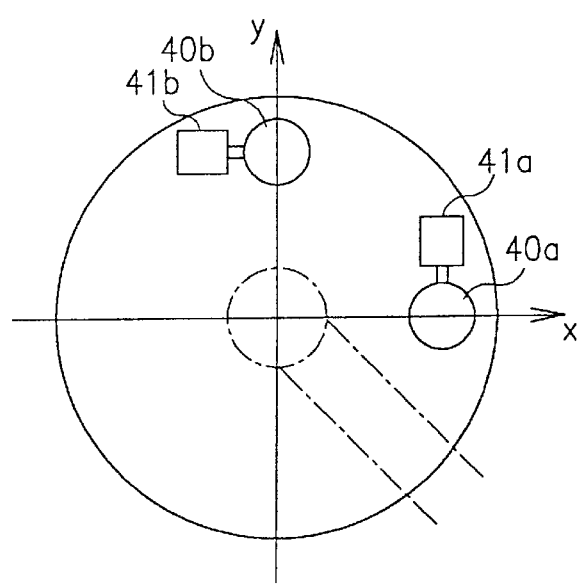
FIG. 5 is a bottom view of the elevator illustrating the horizontal control unit.

The horizontal control driving units 40 may consist of an X-axis horizontal control driving unit 40a and a Y-axis horizontal control driving unit 40b(FIG. 5). The X-axis horizontal control driving unit 40a is located beneath the base 35 and to one side of the origin of X and Y axes along the X-axis. The X-axis horizontal control driving unit 40a controls the inclination of the base 35 about the Y-axis. The Y-axis horizontal control driving unit 40b is located beneath the base 35 to one side of the origin along the Y-axis. The Y-axis horizontal control driving unit 40b controls the inclination of the base 35 about the X axis.

Figure 9:
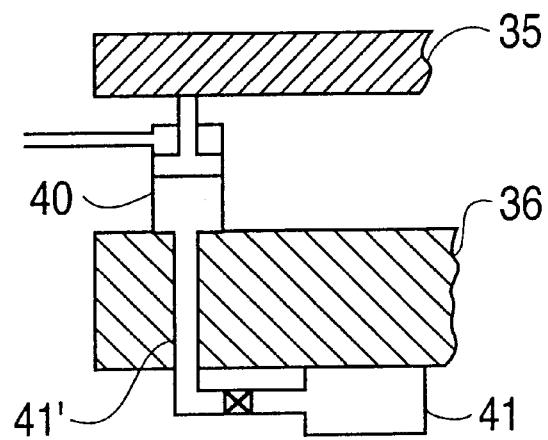
FIG. 9 is a schematic diagram of one portion of the elevator system according to the present invention and in which the horizontal control driving unit is in the form of a hydraulic or pneumatic cylinder.

The horizontal control driving units 40 can comprise various types of devices such as hydraulic or pneumatic cylinders (FIG. 9), or mere tubes (FIGS. 10A and 10B) which can expand or contract in one or both directions upon receipt of hydraulic or pneumatic pressure from the driving force generating mechanisms 41.

When the horizontal control driving units 40 are of the type requiring pneumatic or hydraulic pressure, the driving force generating mechanisms 41 each comprise a pump, and a fluid transfer pipe 41' for transferring the hydraulic or the pneumatic fluid from the pump to the respective horizontal control driving unit 40 associated therewith. In this case, the pumps are controlled by the control unit 44.

In addition, valves 60, such as solenoid operated flow control valves, are provided in the fluid transfer pipes 41' so that the pipes can be selectively opened and closed to control the operation of the horizontal control driving units 40

Figure 10A:
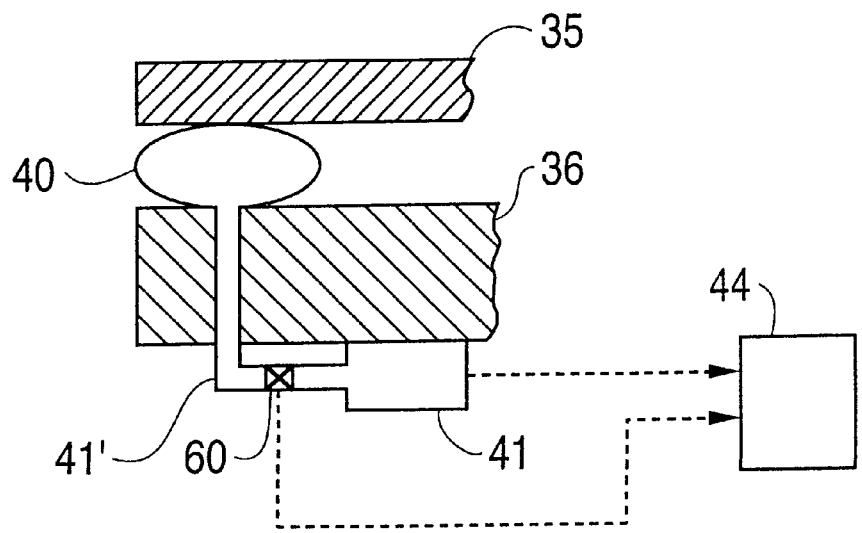
FIG. 10A is a schematic diagram of one portion of the elevator system according to the present invention and in which the horizontal control driving unit is in the form of an inflatable tube.
Figure 10B:
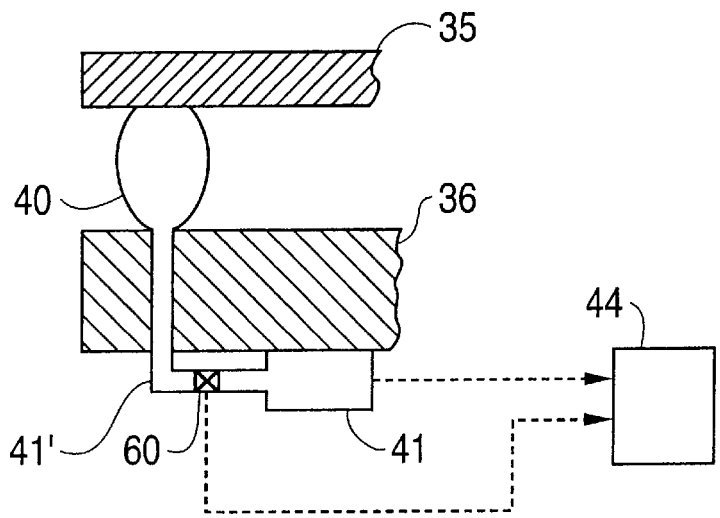
FIG. 10B is a diagram similar to that of FIG. 10A but showing the tube in an inflated state.
Figure 11:
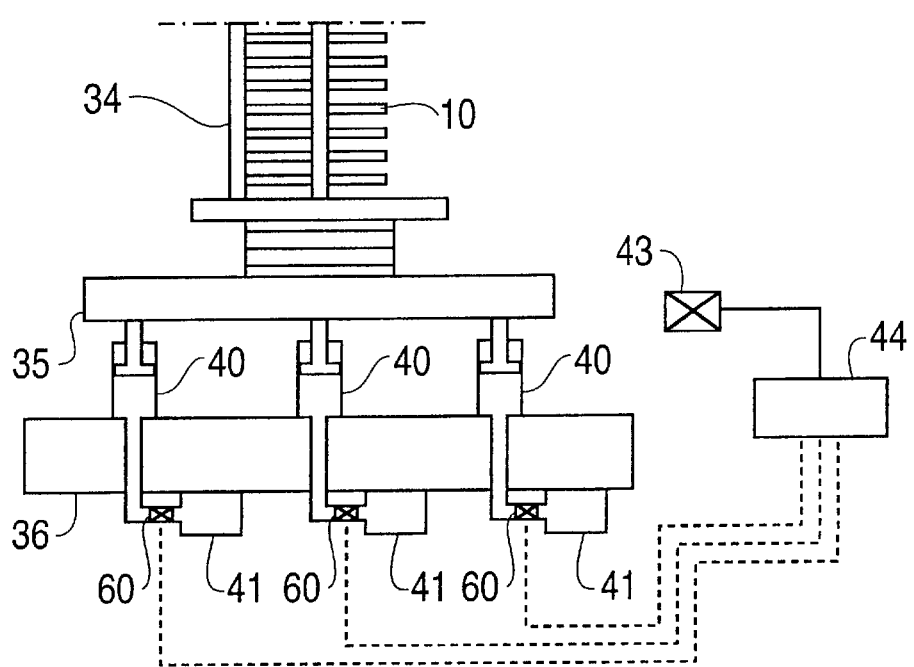
FIG. 11 is a schematic diagram of the elevator system according to the present invention with the elevator omitted for the sake of clarity, and showing the form of the driving force generating mechanism when the horizontal control driving units are of the type requiring fluid under pressure.

(FIGS. 10A, 10B and 11). The opening and closing of such valves 60 is also controlled by the control unit 44.

Figure 6A:
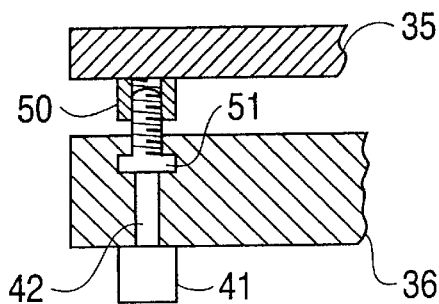
FIG. 6A is a schematic diagram of a portion of the elevator system and showing a horizontal driving unit in the form of a screw jack.

However, each horizontal control driving unit 40 preferably is a screw jack (FIG. 6A) comprising a set of female threads 50 integral with the base 35, a screw member 51 rotatably supported by the horizontal control plate 36 and having male threads engaged with the female threads 50, and a transmission 42 for transmitting the force received from the driving force generating mechanism 41 as torque for rotating the screw member 51.

Figure 6B:
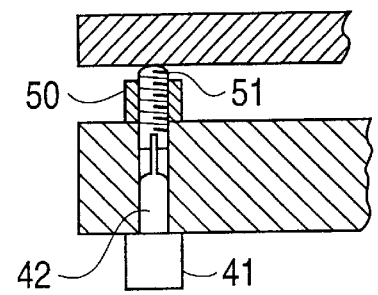
FIG. 6B is a schematic diagram of the same portion of the elevator system but showing another form of a screw jack.

FIG. 6B shows an alternative form of the screw jack in which the screw member 51 is keyed to the transmission 42 so as to be capable of moving vertically when rotated by the transmission 42.

Figure 7A:
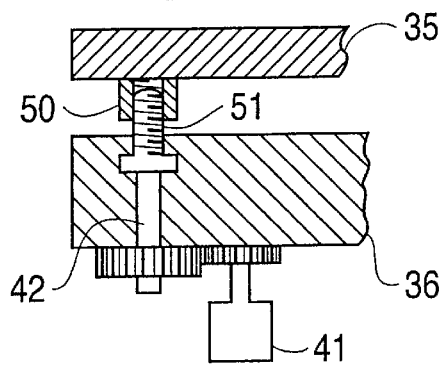
FIG. 7A is a schematic diagram of one portion of the elevator system and showing a gear transmission of the system, which transfers the force from a driving force generating mechanism to the horizontal driving unit.
Figure 7B:
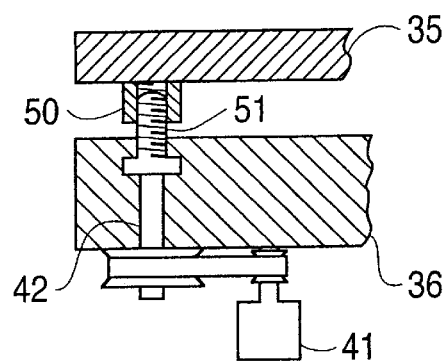
FIG. 7B is a schematic diagram of the same portion of the elevator system but showing a belt and pulley transmission.
Figure 7C:
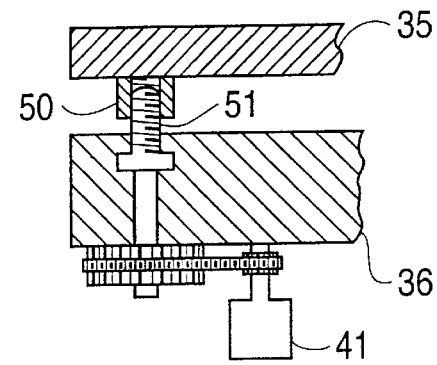
FIG. 7C is a schematic diagram of the same portion of the elevator system but showing a chain and sprocket transmission.
Figure 7D:
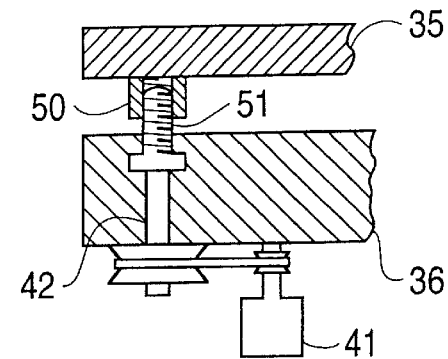
FIG. 7D is a schematic diagram of the same portion of the elevator system but showing a wire and pulley transmission.

The transmission 42 can comprise at least one transmission gear (FIG. 7A), a belt and pulley (FIG. 7B), a chain and sprocket (FIG. 7C), or a wire and pulley (FIG. 7D). Preferably the transmission 42 comprises a plurality of gears.

Figure 8A:
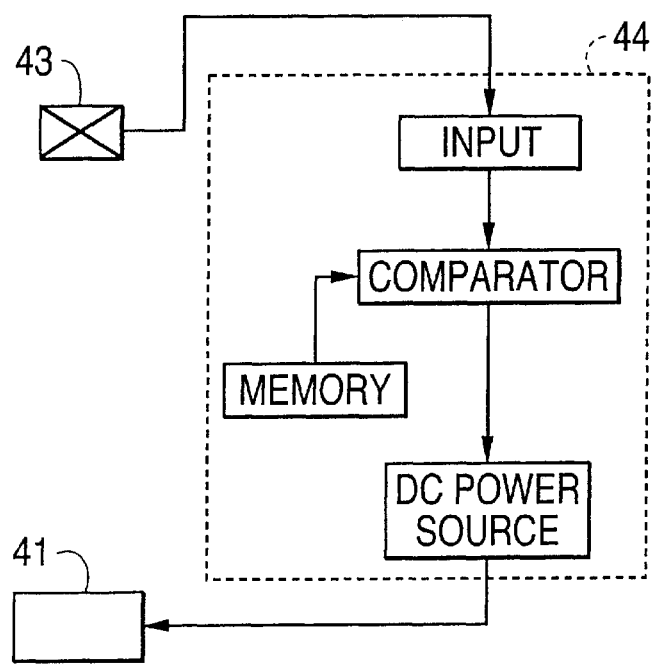
FIG. 8A is a schematic diagram of a control portion of the elevator system according to the present invention, and in which the driving force generating mechanism is a DC motor.
Figure 8B:
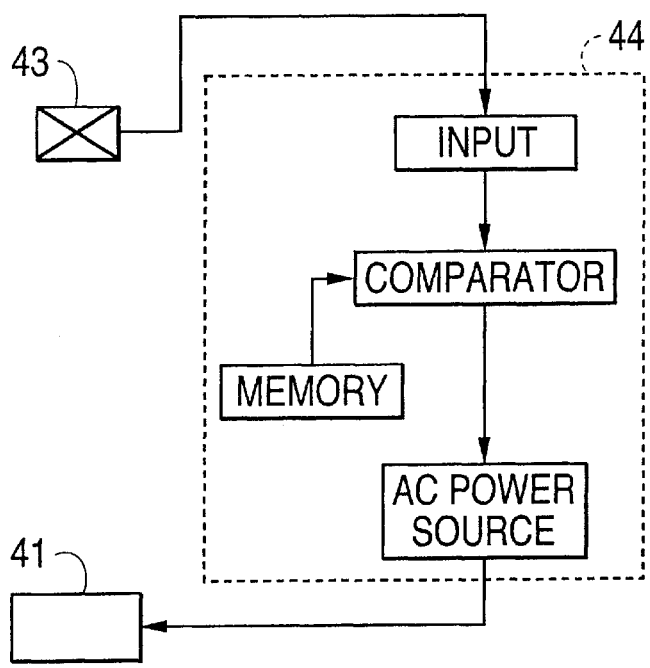
FIG. 8B is a schematic diagram of another form of the control portion of the elevator system according to the present invention, and in which the driving force generating mechanism is an AC motor.
Figure 8C:
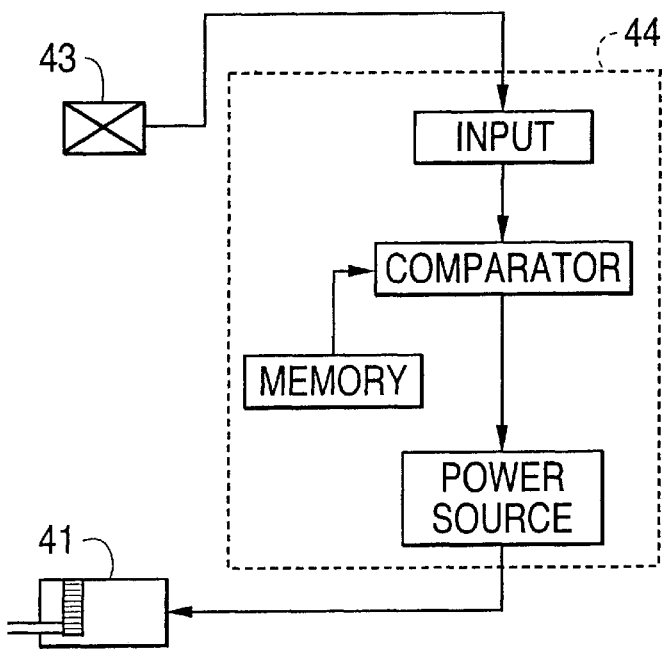
FIG. 8C is a schematic diagram of another form of the control portion of the elevator system according to the present invention, and in which the driving force generating mechanism is a gear reduction motor.
Figure 8D:
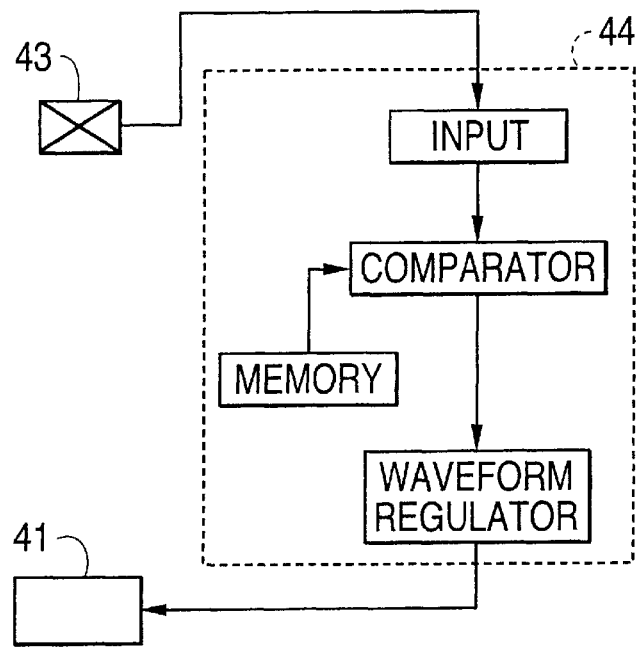
FIG. 8D is a schematic diagram of another form of the control portion of the elevator system according to the present invention, and in which the driving force generating mechanism is a stepper motor.

In addition, the driving force generating mechanism 41 preferably comprises a motor as shown in these figures. The motor may be a DC motor (Direct Current motor) for generating a rotational driving force upon receipt of DC power from the control unit 44 (FIG. 8A), an AC motor (Alternating Current motor) for generating a rotational driving force upon receipt of AC power from the control unit 44 (FIG. 8B), a reduction motor comprising gears connected to an output shaft which rotates at a given number of rpms (FIG. 8C), or a stepper motor having a pulse generator and capable of precise outputs (FIG. 8D). In the present invention, the stepper motor is preferable due to the precision by which its output can be controlled.

The control unit 44 (FIGS. 8A–8D)for controlling the motors 41a and 41b has an input section which receives the information indicative of the orientation of the boat 34 from the sensor 43, and a comparator which compares the information with data stored in the memory of the control unit 44. The control unit 44 controls the motors based on the comparison of the sensed information with the store data. When the motors are AC motors or DC motors (FIGS. 8A and 8B), the control unit 44 regulates the voltage or the current supplied to the motor(s). When the motors are stepper motors (FIG. 8D), the control unit 44 has a waveform regulator (shaper) which converts the power into positive or negative wave pulses which are issued to the stepper motor(s).

Figure 12A:
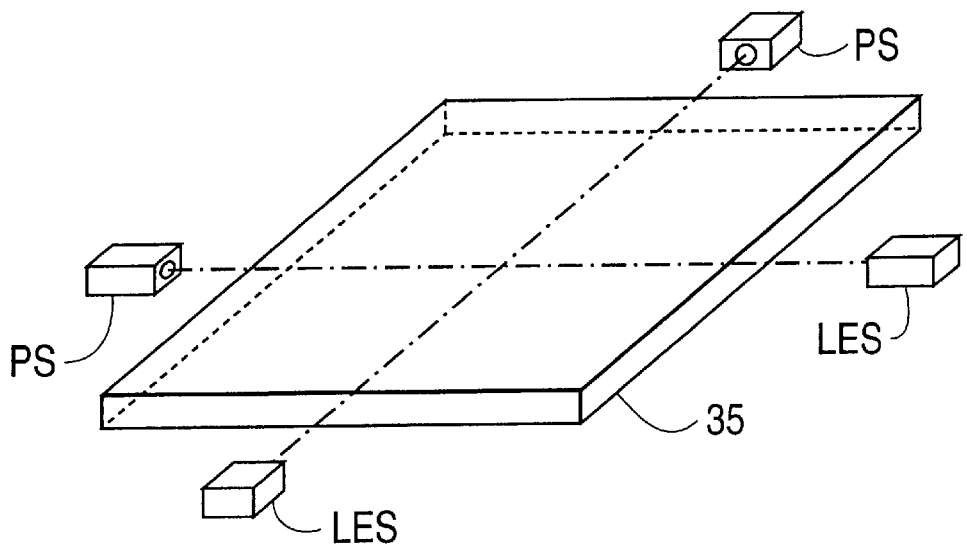
FIG. 12A is a schematic diagram of one form of the sensor unit of the elevator system according to the present invention.

The sensor unit 43 may comprise two pairs of photo-sensors (PS) and light-emitting sensors (LES) positioned adjacent the base 35 or the wafers 10 so that light emitted from one of the light-emitting sensors towards the photo-sensor associated therewith propagates perpendicularly to the light emitted from the other light-emitting sensor (FIG. 12A). The degree to which the photo-sensors receive the rays of light from the light-emitting sensors, respectively, indicates the angle at which the base 35 or the wafers 10 is inclined relative to the horizontal.

Figure 12B:
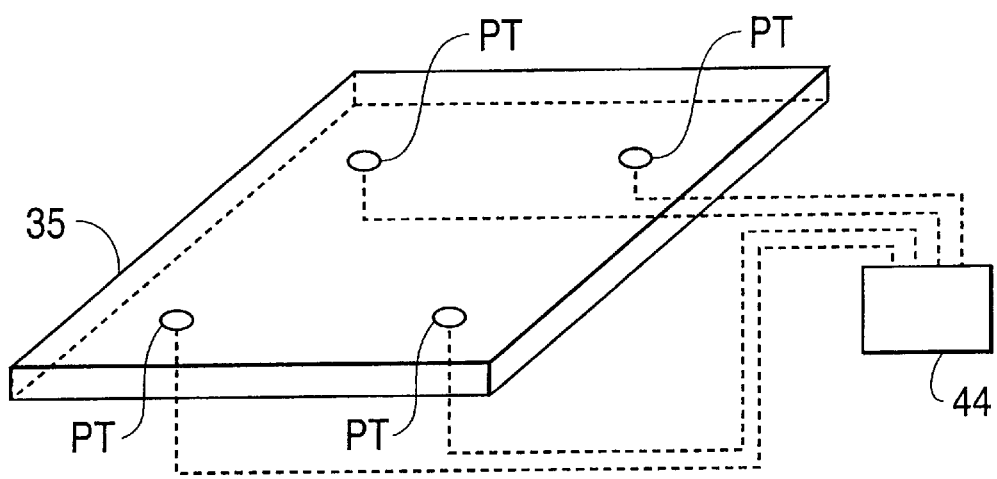
FIG. 12B is a schematic diagram of another form of the sensor unit of the elevator system according to the present invention.

Alternatively, the sensor unit 43 may comprise a plurality of pressure transducers (PT) disposed beneath the base 35 for detecting the load on the base 35 (FIG. 12B).

Figure 12C:
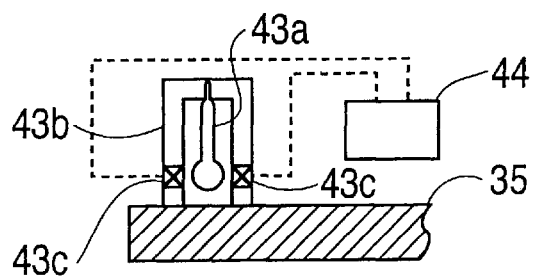
FIG. 12C is a schematic diagram of still another form of the sensor unit of the elevator system according to the present invention.

In another embodiment (FIG. 12C), the sensor unit 43 comprises a pendulum 43a hanging from a stand fixed to the base 35, and contact sensors or pressure transducers 43b located adjacent the pendulum 43a for sensing the same. Because the pendulum 43a remains vertical under the force of gravity as the base 35 becomes inclined relative to the horizontal, the contact sensors or pressure transducers 43b can detect the degree to which the base 35 has tilted relative to the pendulum 43a and hence, the inclination of the base 35 relative to the horizontal.

Figure 12D:
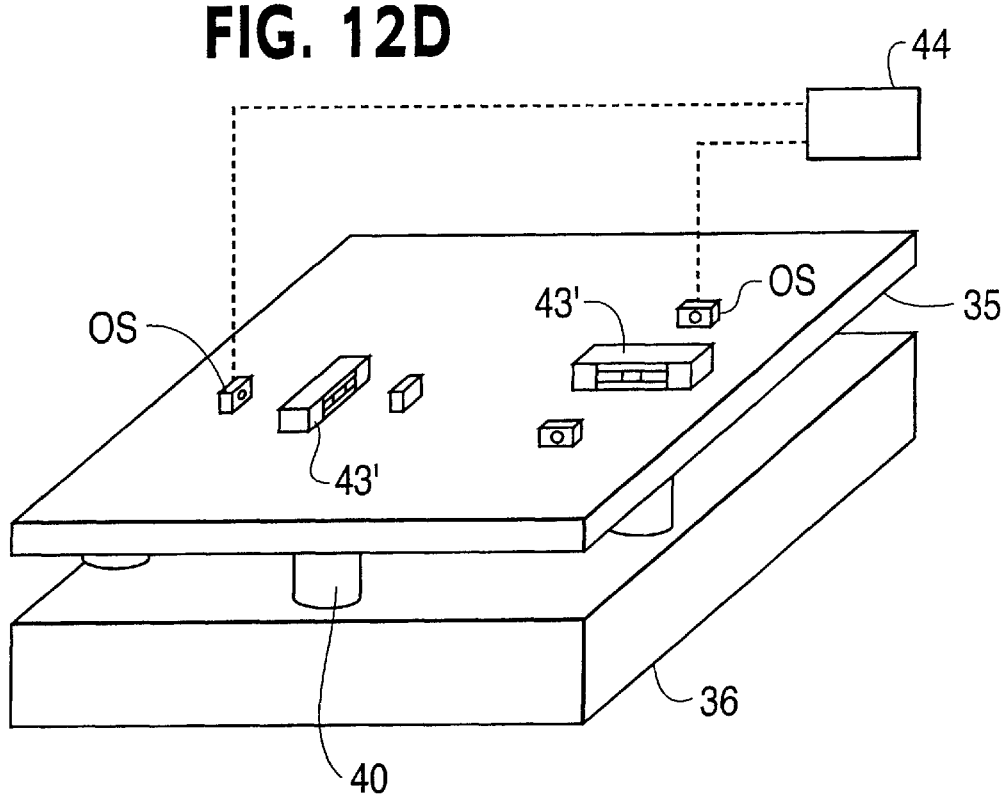
FIG. 12D is a schematic diagram of yet another form of the sensor unit of the elevator system according to the present invention.

Still further, the sensor unit may comprise a level(s) 43' integral with the base 35, and a suitable device, such as an optical sensor OS, for reading the gauge of the level(s) 43' (FIG. 12D).

Figure 13:
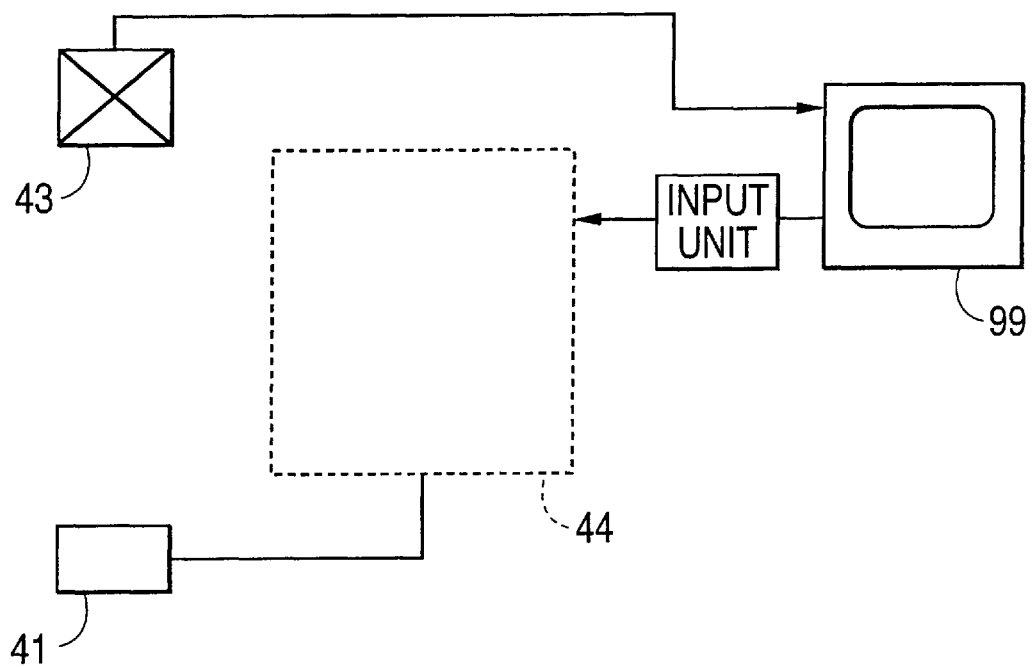
FIG. 13 is another schematic diagram of the control portion of the elevator system according to the present invention.

Next, referring to FIG. 13, a display unit 99 is connected to the sensor unit 43 and the control unit 44. The display unit 99 receives the information regarding the attitude of the base 35 or of the wafers 10 from the sensor unit 43 and displays the information to an operator. An input unit 100 is connected to the control unit 44. When the input unit 100 receives a horizontal alignment operation order, it converts the order into code, and transfers the code to the control unit 44.

During operation, an operator checks the display unit 99 to find out whether the base 35 or the wafers 10 is/are inclined relative to the horizontal. If the base 35 or the wafer 10 is/are inclined relative to the horizontal, the operator inputs an order to the control unit 44 via the input unit 100. Upon receipt of this order, the control unit 44 analyzes the information produced by the sensor unit 43, and controls appropriate ones of the driving force generating mechanism (s) to drive the transmission(s) 42 connected to the horizontal control driving unit(s) 40 or to pump fluid thereto, as the case may be.

This operation is executed periodically according to a program stored in the control unit 44. This program is accessed upon order of the operator.

As has been described above, the elevator system of the present invention periodically detects the orientation of the wafers in the boat, and based on such detections automatically makes any adjustments needed to maintain the wafers horizontal. The automatic adjusting of the orientation of the wafers saves much time over making the same adjustments manually. Furthermore, the periodic detection of the orientation of the wafers ensures that the wafers will be horizontal as they are moved by the elevator into a processing chamber, for example. Therefore, the present invention ensures that products of high quality will be made by the processing of the wafers.

Although the present invention has been described in detail above with respect to the preferred embodiments thereto, various changes, substitutions and alterations thereof will become apparent to those of ordinary skill in the art. All such changes, substitutions and alterations are thus seen to be within the true spirit and scope of the invention as defined by the appended claims.

What is claimed is:

1. An elevator system for transferring semiconductor wafers, the system comprising:

a boat configured to support a plurality of semiconductor wafers parallel to one another;

a base on which said boat is supported;

an elevator connected to said boat so as to move said boat up and down;

sensor means for detecting when said boat is in a position in which wafers in said boat lie in planes inclined relative to the horizontal;

horizontal control means for tilting said base to adjust the position of said boat; and a control unit, operatively connected to said sensor means and to said horizontal control means, so as to receive information from said sensor means indicative of the orientation of said boat and, based on the information, output a control signal to said horizontal control means.

2. The elevator system of claim 1, wherein said horizontal control means comprises a horizontal control plate fixed to said elevator, a plurality of horizontal control units interposed between said base and said horizontal control plate, each of said horizontal control units being drivable to change the distance between respective portions of said base and said horizontal control plate and thereby tilt said base at the respective portions thereof, and driving means operatively connected to said horizontal control units for driving said horizontal control units.

3. The elevator system of claim 2, wherein each of said horizontal control units comprises a set of female threads integral with one of said base and said horizontal control plate, a screw threaded to said set of female threads and extending vertically, and a transmission connected to said screw and to said driving means so as to transfer an output of said driving means to said screw in the form of torque that rotates said screw.

4. The elevator system of claim 3, wherein said transmission comprises at least one gear.

5. The elevator system of claim 3, wherein said transmission comprises at least one belt and one pulley around which the belt wraps.

6. The elevator system of claim 3, wherein said transmission comprises at least one chain and one sprocket wheel around which the chain wraps.

7. The elevator system of claim 3, wherein said transmission comprises at least one wire and one pulley around which the wire wraps.

8. The elevator system of claim 3, wherein said driving means comprises a DC motor, and said control unit includes a DC power source connected to said DC motor.

9. The elevator system of claim 3, wherein said driving means comprises an AC motor, and said control unit includes an AC power source connected to said AC motor.

10. The elevator system of claim 3, wherein said driving means comprises a geared reduction motor.

11. The elevator system of claim 3, wherein said driving means comprises a stepper motor.

12. The elevator system of claim 8, wherein said control unit has an input section which receives said information indicative of the orientation of said boat, a memory which stores data, and a comparator which compares the received data with the data stored in said memory, said DC power source being operatively connected to said comparator so as to control said DC motor based on the comparison made by said comparator.

13. The elevator system of claim 9, wherein said control unit has an input section which receives said information indicative of the orientation of said boat, a memory which stores data, and a comparator which compares the received data with the data stored in said memory, said AC power source being operatively connected to said comparator so as to control said AC motor based on the comparison made by said comparator.

14. The elevator system of claim 10, wherein said control unit has a power source connected to said geared reduction motor, an input section which receives said information indicative of the orientation of said boat, a memory which stores data, and a comparator which compares the received data with the data stored in said memory, said power source being operatively connected to said comparator so as to control said geared reduction motor based on the comparison made by said comparator.

15. The elevator system of claim 11, wherein said control unit has an input section which receives said information indicative of the orientation of said boat, a memory which stores data, a comparator which compares the received data with the data stored in said memory, a power source, and a waveform regulator operatively connected to said power source and to said stepper motor so as to convert power from said power source into pulses whose waveform is based on the comparison made by said comparator, the pulses being issued to said stepper motor.

16. The elevator system of claim 3, wherein said transmission consists of rotary shaft.

17. The elevator system of claim 2, wherein said horizontal control drive units comprise an X-axis horizontal control driving unit located beneath said base and to one side of the origin of X and Y axes along the X-axis, said X-axis horizontal control driving unit controlling the inclination of said base about the Y-axis, and a Y-axis horizontal control driving unit located beneath said base to one side of the origin along the Y-axis, said Y-axis horizontal control driving unit controlling the inclination of said base about the X axis.

18. The elevator system of claim 2, wherein each of said horizontal control driving units comprises a hydraulic cylinder.

19. The elevator system of claim 2, wherein each of said horizontal control driving units comprises a pneumatic cylinder.

20. The elevator system of claim 2, wherein each of said horizontal control driving units comprises an inflatable tube interposed between said base and said horizontal control plate.

21. The elevator system of claim 18, wherein said driving unit means comprises a pump operatively connected to said hydraulic cylinder.

22. The elevator system of claim 19, wherein said driving unit means comprises a pump operatively connected to said pneumatic cylinder.

23. The elevator system of claim 20, wherein said driving unit means comprises a fluid pump operatively connected to said inflatable tube.

24. The elevator system of claim 18, wherein said driving means comprises piping connected to the hydraulic cylinder of each of said horizontal driving units, and valves disposed in said piping, said control unit being operatively connected to said valves so as to open and close said valves based on the information received from said sensor means.

25. The elevator system of claim 19, wherein said driving means comprises piping connected to the pneumatic cylinder of each of said horizontal driving units, and valves disposed in said piping, said control unit being operatively connected to said valves so as to open and close said valves based on the information received from said sensor means.

26. The elevator system of claim 20, wherein said driving means comprises piping connected to the inflatable tube of each of said horizontal driving units, and valves disposed in said piping, said control unit being operatively connected to said valves so as to open and close said valves based on the information received from said sensor means.

27. The elevator system of claim 1, wherein said sensor means comprises a level gauge disposed on said base.

28. The elevator system of claim 1, wherein said sensor means comprises two pairs of photo-sensors and light-emitting sensors positioned relative to one another such that light emitted from one of the light-emitting sensors towards the photo-sensor associated therewith propagates perpendicularly to the light emitted from the other light-emitting sensor toward the photo-sensor associated therewith.

29. The elevator system of claim 1, wherein said sensor means comprises a plurality of pressure transducers disposed under said base for detecting the load on said base.

30. The elevator system of claim 1, wherein said sensor means comprises a stand fixed to said base, a pendulum hanging from said stand, and sensors located adjacent said pendulum.

31. The elevator system of claim 1, and further comprising a display unit connected to said control unit and displaying the information indicative of the orientation of said boat.

32. The elevator system of claim 1, and further comprising an input unit operatively connected to said control unit for receiving a horizontal alignment operation order, converting the order into code, and transferring the code to the control unit.

33. The elevator system of claim 1, wherein said control unit stores a program by which the control unit periodically and repeatedly processes the information received from said sensor means indicative of the orientation of said boat.

* * * * *